United States Patent [19]
Isshiki et al.

[11] Patent Number: 5,958,515
[45] Date of Patent: Sep. 28, 1999

[54] ELECTRICAL COMPONENTS AND METHOD FOR THE FABRICATION THEREOF

[75] Inventors: Minoru Isshiki; Katsutoshi Mine; Kimio Yamakawa, all of Chiba Prefecture, Japan

[73] Assignee: Dow Corning Toray Silicone Co., LTD., Tokyo, Japan

[21] Appl. No.: 08/923,074

[22] Filed: Sep. 3, 1997

[30] Foreign Application Priority Data

Sep. 4, 1996 [JP] Japan .................................. 8-253901

[51] Int. Cl.$^6$ ...................................................... B05D 3/02
[52] U.S. Cl. .................... 427/387; 106/287.12; 156/329; 525/476; 525/477; 528/14; 528/34; 528/37
[58] Field of Search .................................. 528/14, 34, 37; 525/476, 477; 427/387; 156/329; 106/287.12

[56] References Cited

U.S. PATENT DOCUMENTS

| | | | |
|---|---|---|---|
| 4,122,127 | 10/1978 | Mikami et al. | 260/825 |
| 4,645,551 | 2/1987 | Adams et al. | 156/82 |
| 5,187,014 | 2/1993 | Suzuki et al. | 428/447 |
| 5,213,617 | 5/1993 | Blizzard | 106/287.13 |
| 5,516,858 | 5/1996 | Morita et al. | 525/478 |

FOREIGN PATENT DOCUMENTS

| | | | |
|---|---|---|---|
| 0 510 608 | 4/1991 | European Pat. Off. | C08L 83/04 |
| 0 596 534 | 5/1994 | European Pat. Off. | C08L 83/07 |
| 0 718 433 | 6/1996 | European Pat. Off. | D06M 15/65 |
| 0 789 057 | 8/1997 | European Pat. Off. | C08L 63/00 |
| 0 818 511 | 1/1998 | European Pat. Off. | C08L 101/00 |
| 0 821 038 | 1/1998 | European Pat. Off. | C08L 83/04 |
| 54-045361 | 4/1979 | Japan | C08L 83/04 |
| 1-94679 | of 1989 | Japan . | |
| 2-27756 | of 1990 | Japan . | |
| 2 208 650 | 4/1989 | United Kingdom | C08L 83/07 |

*Primary Examiner*—Melvyn I. Marquis
*Assistant Examiner*—Mark W. Milstead
*Attorney, Agent, or Firm*—Catherine U. Brown; Sharon K. Severance; Timothy J. Troy

[57] ABSTRACT

This invention relates to a primer that improves adherence of a cured resin sealant to a cured silicone coating on an electrical element, wherein said primer is selected from the group consisting of:

(i) a mixture of components (a) and (b),
(ii) a reaction mixture of components (a) and (b),
(iii) component (c),
(iv) component (c) and a mixture of components (a) and (b), and
(v) component (c) and a reaction mixture of components (a) and (b), where component (a) is silanol-functional organopolysiloxane; component (b) is epoxy-functional organoalkoxysilane; and component (c) is organopolysiloxane with the average unit formula:

$$(R^1SiO_{3/2})_a(R^2{}_2SiO_{2/2})_b(R^2{}_3SiO_{1/2})_c(R^3O_{1/2})_d$$

where $R^1$ is an epoxy-functional monovalent organic group; each $R^2$ is independently a monovalent hydrocarbon group, $R^3$ is selected from the group consisting of hydrogen and alkyl groups of 1 to 4 carbon atoms; a, b, and d are each a positive number; and c is 0 or a positive number.

9 Claims, 2 Drawing Sheets

ELECTRICAL COMPONENTS AND METHOD FOR THE FABRICATION THEREOF

BACKGROUND OF THE INVENTION

This invention relates to electrical components and methods for their fabrication. More particularly, the invention relates to highly reliable electrical components in which cured silicone coated on an electrical element has been thoroughly monolithically adhered with cured resin sealant coated on the cured silicone. The invention also relates to a highly productive method for fabricating the electrical components.

Electrical elements, e.g., integrated circuits, hybrid integrated circuits, semiconductor chips, transistors, diodes, capacitors, resistors, etc., are generally coated with a cured resin sealant. The sealant protects the element from external stresses (flexural stresses, impact, etc.), prevents water infiltration, and improve moistures resistance. In addition, the electrical element may also be coated with cured silicone to protect it from internal stresses originating from the expansion and shrinkage of the cured resin sealant. However, the cured silicone does not bond or adhere to the over-coated cured resin sealant, which results in unacceptable reliability for the resin-sealed electrical component.

To date, monolithic bonding between the cured silicone coating the electrical element and the cured sealant resin over-coating the cured silicone has been pursued by treating the surface of the cured silicone with ultraviolet radiation and sealing this UV-treated cured silicone with the resin sealant (U.S. Pat. No. 4,645,551, JP-A-64-27249, JP-A-1-94679, JP-A-2-27756, and JP-A-3-22553).

However, even electrical components of this type suffer from an unacceptable adherence between the cured silicone and the cured resin sealant. As a result, the reliability of these resin-sealed electrical components remains unsatisfactory. Moreover, the methods for fabricating these electrical components suffer from poor productivity because they require irradiation with ultraviolet light.

Therefore, an object of the present invention is to provide highly reliable electrical components with the cured silicone coating the electrical element thoroughly bonded into a monolithic mass with the cured resin sealant coated on the cured silicone. A further object of this invention is to provide a highly productive method for the fabrication of the electrical components.

SUMMARY OF THE INVENTION

The primer of the present invention is selected from the group consisting of:
(i) a mixture of components (a) and (b),
(ii) a reaction mixture of components (a) and (b),
(iii) component (c),
(iv) component (c) and a mixture of components (a) and (b), and
(v) component (c) and a reaction mixture of components (a) and (b),
where component (a) is silanol-functional organopolysiloxane; component (b) is epoxy-functional organoalkoxysilane; and component (c) is organopolysiloxane with the average unit formula:

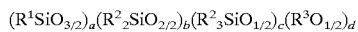

where $R^1$ is an epoxy-functional monovalent organic group; each $R^2$ is independently a monovalent hydrocarbon group, $R^3$ is selected from the group consisting of hydrogen and alkyl groups of 1 to 4 carbon atoms; a, b, and d are each a positive number; and c is 0 or a positive number.

The fabrication method for electrical components of the present invention comprises:
(A) treating the surface of the cured silicone coated on an electrical element with the primer of this invention, and
(B) sealing the treated cured silicone with a resin sealant.

DETAILED DESCRIPTION OF THE INVENTION

Figure 1:
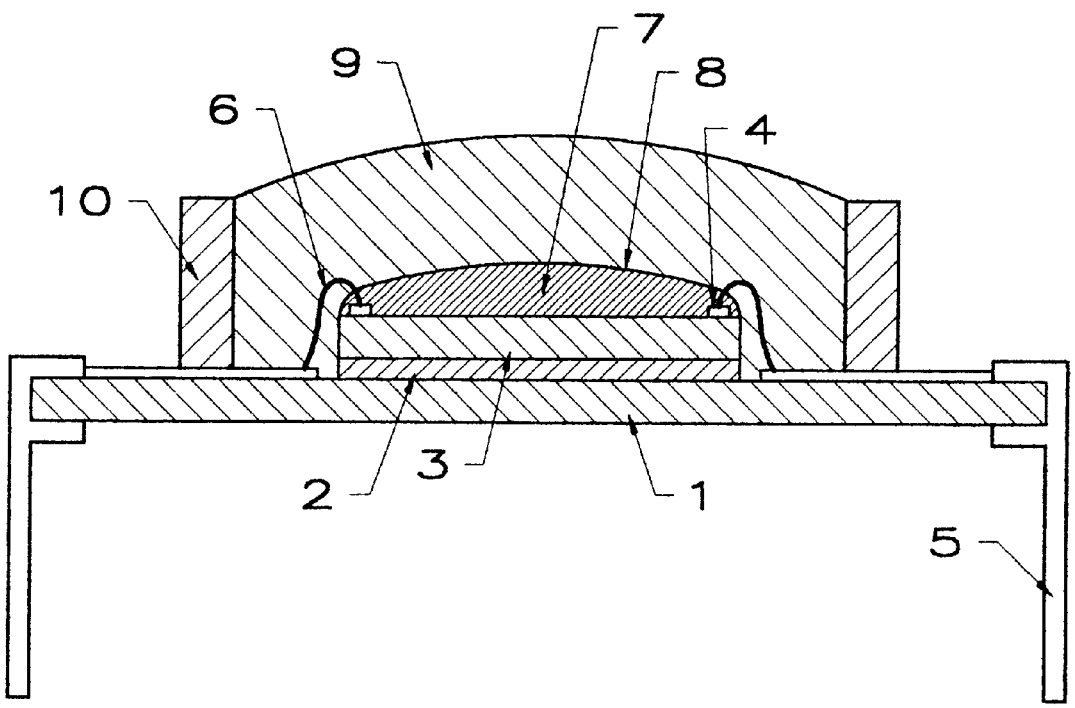
FIG. 1 contains a cross section of a semiconductor device provided as an electrical component according to the present invention.

The electrical components of the present invention have the cured silicone coated on an electrical element thoroughly adhered into a monolith with the cured resin sealant over-coated on the cured silicone. The cured silicone under consideration is not critical and may take the form, for example, of a gel, rubber, or hard resin. The compositions giving this cured silicone can be, for example, addition reaction-curing silicone compositions or condensation reaction-curing silicone compositions. Addition reaction-curing silicone compositions are preferred, while addition reaction-curing silicone compositions that generate silicone rubbers are particularly preferred. Addition reaction-curing silicone compositions of this type are exemplified by compositions comprising organopolysiloxane having at least 2 alkenyl groups per molecule, organopolysiloxane having at least 2 silicon-bonded hydrogen atoms per molecule, and platinum catalyst.

Cured resin sealants generally are relatively poorly adhesive to the cured products. The sealants are particularly poorly adhesive to the silicone rubbers afforded by the cure of addition reaction-curing silicone compositions comprising organopolysiloxane having at least 2 alkenyl groups per molecule, organopolysiloxane having at least two silicon-bonded hydrogen atoms per molecule, and platinum catalyst. However, these addition reaction-cured silicones are still preferably used as the cured silicone because, in an electrical component of the present invention, they become thoroughly adhered into a monolithic mass with the cured resin sealant over-coated on the cured silicone.

Adherence between the cured silicone coating and cured resin sealant is improved by this invention by treating the surface of the coating with a primer. The primer of the present invention is selected from the group consisting of:
(i) a mixture of components (a) and (b),
(ii) a reaction mixture of components (a) and (b),
(iii) component (c),
(iv) component (c) and a mixture of components (a) and (b), and
(v) component (c) and a reaction mixture of components (a) and (b),
where component (a) is silanol-functional organopolysiloxane; component (b) is epoxy-functional organoalkoxysilane; and component (c) is organopolysiloxane with the average unit formula:

$(R^1SiO_{3/2})_a(R^2{}_2SiO_{2/2})_b(R^2{}_3SiO_{1/2})_c(R^3O_{1/2})_d$ where $R^1$ is an epoxy-functional monovalent organic group; each $R^2$ is independently a monovalent hydrocarbon group, $R^3$ is selected from the group consisting of hydrogen and alkyl groups of 1 to 4 carbon atoms; a, b, and d are each a positive number; and c is 0 or a positive number.

Silanol-functional organopolysiloxane (a) contains the silanol group, i.e., the silicon-bonded hydroxyl group. Particularly preferred is organopolysiloxane that contains at least 2 silanol groups per molecule. The molecular chain structure of component (a) can be, for example, straight, partially branched straight, branched, cyclic, or network. Straight-chain molecular structures are preferred.

The silicon-bonded organic groups in component (a) are exemplified by substituted and unsubstituted monovalent hydrocarbon groups, e.g., by alkyl groups such as methyl, ethyl, propyl, butyl, pentyl, hexyl, heptyl, and so forth; alkenyl groups such as vinyl, allyl, butenyl, pentenyl, hexenyl, heptenyl, and so forth; aryl groups such as phenyl, totyl, xylyl, naphthyl, and so forth; aralkyl groups such as benzyl, phenethyl, and so forth; and halogenated alkyl groups such as chloromethyl, 3-chloropropyl, 3,3,3-trifluoropropyl, and so forth. Methyl, vinyl, and phenyl are particularly preferred.

Component (a) is specifically exemplified by silanol-endblocked dimethylpolysiloxanes, silanol-endblocked dimethylsiloxane-methylvinylsiloxane copolymers, and silanol-endblocked dimethylsiloxane-methylphenylsiloxane copolymers. The viscosity of component (a) at 25° C. is, for example, preferably from 1 to 500 mPa s, more preferably from 1 to 200 mPa s, and particularly preferably from 1 to 100 mPa s because such values afford substantial effects from the primer treatment.

Epoxy-functional organoalkoxysilane (b) contains the epoxy group and is exemplified by organoalkoxysilane with the general formula $R^1Si(OR^4)_3$. $R^1$ represents epoxy-functional monovalent organic groups, for example, glycidoxyalkyl groups such as 3-glycidoxypropyl, 4-glycidoxybutyl, and so forth; epoxycyclohexylalkyl groups such as 2-(3,4-epoxycylohexyl)ethyl, 3-(3,4-epoxycyclohexyl)propyl, and so forth; and oxiranylalkyl groups such as 4-oxiranylbutyl, 8-oxiranyloctyl, and so forth. Glycidoxyalkyl groups such as 3-glycidoxypropyl and so forth are specifically preferred here. $R^4$ formula represents alkyl groups of 1 to 4 carbon atoms, for example, methyl, ethyl, propyl, and butyl, wherein methyl is specifically preferred.

Component (b) is specifically exemplified by
3-glycidoxypropyltrimethoxysilane,
2-(3,4-epoxycyclohexyl)ethyltrimethoxysilane,
4-oxiranylbutyltrimethoxysilane, and
8-oxiranyloctyltrimethoxysilane
wherein 3-glycidoxypropyltrimethoxysilane is particularly preferred.

Components (a) and (b) may simply be mixed or may be subjected to condensation and equilibration reactions. The component (a):component (b) mixing ratio or reaction ratio is preferably from 1:99 to 99:1 by weight.

Organopolysiloxane (c) is represented by the following average unit formula:

$(R^1SiO_{3/2})_a(R^2{}_2SiO_{2/2})_b(R^2{}_3SiO_{1/2})_c(R^3O_{1/2})_d$ where $R^1$, $R^2$, $R^3$, a, b, c, and d are defined above. Glycidoxyalkyl groups, such as 3-glycidoxypropyl and so forth, are specifically preferred for $R^1$.

$R^2$ is exemplified by substituted and unsubstituted monovalent hydrocarbon groups as exemplified by alkyl such as methyl, ethyl, propyl, butyl, and so forth; alkenyl such as vinyl, allyl, butenyl, pentenyl, hexenyl, and so forth; aryl such as phenyl, tolyl, xylyl, and so forth; aralkyl such as benzyl, phenethyl, and so forth; and halogenated alkyl groups such as 3,3,3-trifluoropropyl and so forth. Methyl, vinyl, and phenyl are specifically preferred for $R^2$.

$R^3$ is exemplified by methyl, ethyl, propyl, and butyl.

The viscosity of component (c) at 25° C. is, for example, preferably from 1 to 500 mPa s, more preferably from 1 to 200 mPa s, and particularly preferably from 1 to 100 mPa s because such values afford substantial effects from the primer treatment.

Component (c) can be synthesized, for example, by an equilibration polymerization in the presence of a polymerization catalyst, e.g., potassium hydroxide, etc., between epoxy-functional alkoxysilane and straight-chain-to-cyclic diorganosiloxane.

The primer treated cured silicone is sealed with a cured resin sealant. The resin sealant is not critical and can be, for example, the cured product from curable epoxy, phenolic, polyphenylene sulfide, polyetheramide, and polyimide resins. Curable epoxy resins are particularly preferred.

The curable epoxy resins are exemplified by the glycidyl ether epoxy resins, for example, bisphenol A-type, bisphenol F-type, biphenyl, phenol novolac, ortho-cresol novolac, brominated, and so forth; alicyclic epoxy resins; glycidyl ester epoxy resins; glycidyl amine epoxy resins; and heterocyclic epoxy resins. The cure mechanisms in these curable epoxy resins can be, for example, heat-curing, UV-curing, or moisture curing, wherein heat-curing mechanisms are specifically preferred. Moreover, while the curable epoxy resin can be a liquid at room temperature or can be a solid having a softening point of at least room temperature, curable epoxy resins that are liquid at room temperature are preferred for their good handling properties.

The electrical component of the present invention can be, for example, a transistor, diode, capacitor, or resistor or a semiconductor device that contains an electrical element such as a semiconductor element (e.g., integrated circuit, hybrid integrated circuit, computer chip, and so forth), transistor, diode, capacitor, resistor, and so forth. Semiconductor devices and capacitors are specifically preferred for the electrical component. An example of a semiconductor device is provided in FIG. 1, while FIG. 2 contains an example of a capacitor.

The semiconductor device in FIG. 1 is herein described in detail. A semiconductor element 3 is mounted in this semiconductor device on a circuit substrate 1 through an interposed adhesive 2. The upper edges of this semiconductor element 3 are provided with bonding pads 4, while outer leads 5 are provided at the edges of the circuit substrate 1. The bonding pads 4 are electrically connected to the circuit substrate 1 by bonding wires 6. The semiconductor element 3 is coated with cured silicone 7, and a primer-treated layer 8, of the composition described above, has been formed on the surface of this cured silicone 7. Cured resin sealant 9 is coated over the cured silicone. In order to prevent outflow of the sealant resin, a frame or dam 10 is provided around the periphery of the semiconductor element 3. The cured silicone 7 is thoroughly bonded into a monolith with the over-coated cured resin sealant 9 through the interposed primer-treated layer 8 formed on the surface of the cured silicone 7.

Figure 2:
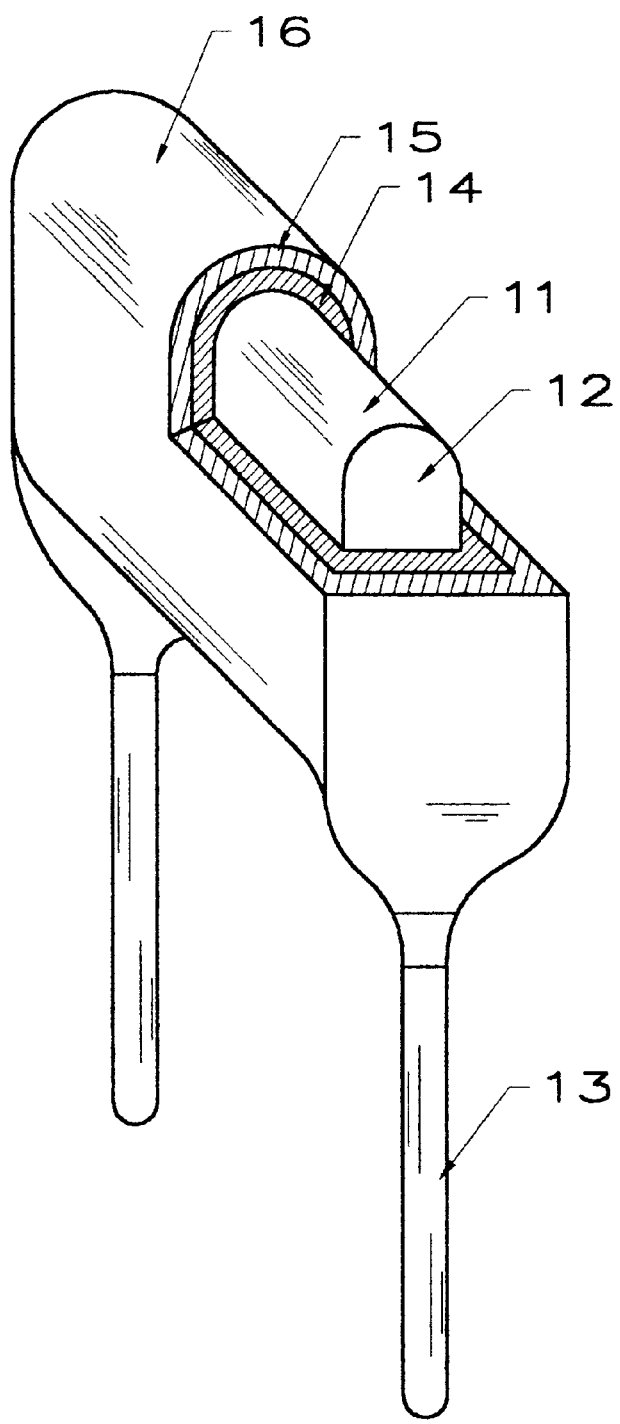
FIG. 2 contains an oblique view with partial cut-away of a capacitor provided as an electrical component according to the present invention

The capacitor, FIG. 2, contains Al-vapor-deposited (metallized) polyester film 11 in either a rolled or layered configuration, and electrodes 12 are provided by coating both ends with flame-coated metal. These electrodes 12 are electrically connected with outer leads 13. The capacitor is coated with cured silicone 14, while a primer-treated layer 15, of the composition described above, has been formed on the surface of this cured silicone 14. Cured resin sealant 16 is coated over the cured silicone. The cured silicone 14 is thoroughly bonded into a monolith with the over-coated cured resin sealant 16 through the interposed primer-treated layer 15 formed on the surface of the cured silicone 14.

The method for fabricating the electrical components of the present invention is described in detail as follows. Before fabricating the semiconductor device of FIG. 1, first the semiconductor device 3 must be mounted on the circuit substrate 1 using interposed adhesive 2 and the bonding pads 4 on the upper edges of this semiconductor device 3 must be electrically connected with the circuit substrate 1 by bonding wires 6. In addition, when the resin sealant is fluid, a dam or frame 10 is preferably provided around the periphery of the semiconductor element 3 in order to inhibit outflow of the resin sealant.

Before fabricating the capacitor of FIG. 2 as the electrical component, first the Al-vapor-deposited (metallized) polyester film 11 must be rolled up or laminated, the electrodes 12 must be formed by coating both ends with flame-coated metal, and the outer leads 13 must be electrically connected to the electrodes 12.

The method for coating the cured silicone onto electrical elements such as a transistor, diode, capacitor, resistor, semiconductor element (e.g., integrated circuits, hybrid integrated circuits, computer chips, and so forth), and so forth is not critical. Coating can be effected with the silicone compositions described previously.

The fabrication method of the present invention commences with primer treatment of the surface of cured silicone coated on an electrical element such as those described above. Primer treatment can be by application of the primer described above by spraying, brush application, dipping, and so forth. The primer is preferably used in this operation diluted with organic solvent or with organopolysiloxane or alkoxysilane with a viscosity at 25° C. no greater than 50 mPa s. The organic solvent is exemplified by hydrocarbon solvents such as toluene, xylene, hexane, heptane, etc.; ketone solvents such as acetone, methyl ethyl ketone, etc.; alcohol solvents such as methyl alcohol, ethyl alcohol, isopropyl alcohol, etc.; and also by chlorinated hydrocarbon solvents and fluorinated hydrocarbon solvents.

Dilution with alkoxysilane or organopolysiloxane is particularly preferred. The alkoxysilane is exemplified by methyltrimethoxysilane, vinyltrimethoxysilane, and so forth, while the organopolysiloxane is exemplified by straight-chain siloxanes such as hexamethyldisiloxane, trimethylsilyl-endblocked dimethylpolysiloxanes, and so forth, and by cyclic siloxanes such as octamethylcyclotetrasiloxane, tetramethyltetravinylcyclotetrasiloxane, and so forth.

The primer can then be dried, for example, by air-drying at ambient temperature or by heating to no more than 200° C. as a function of the particular requirements.

The primer-treated cured silicone is subsequently coated with the resin sealant described previously. The treated cured silicone can be coated with the resin sealant by, for example, transfer molding, injection molding, potting, casting, application by dipping, application by dripping as from a dispenser, spray coating, brush application, and so forth. To cure the resin, heat-curing resins can be heated to 50° C. to 250° C.; UV-curing resins can be exposed to UV radiation from a light source; and moisture=curable resins can be held at room temperature. The resin can be heated, for example, using an oven, hot plate, heat lamp, and the like.

Electrical components of the present invention have excellent reliability because the cured silicone coating the electrical element is well bonded into a monolithic mass with the cured resin sealant over-coated on the cured silicone. The method of the present invention for fabricating these electrical components is highly productive and workable.

EXAMPLES

So that those skilled in the art can understand and appreciate the invention taught herein, the following examples are presented, it being understood that these examples should not be used to limit the scope of the invention found in the claims.

The viscosity values reported in the examples were measured at 25° C. The following procedures were used to evaluate the adherence of the cured resin sealant to the cured silicone and to evaluate the reliability of the electrical components (semiconductor device, capacitor).

Synthesis of the Curable Silicone Composition

The following were mixed to homogeneity to give an addition reaction-curing silicone composition: 97.9 weight parts dimethylvinylsiloxy-endblocked dimethylpolysiloxane with a viscosity of 400 mPa s, 2.0 weight parts trimethylsiloxy-endblocked dimethylsiloxane-methylhydrogensiloxane copolymer with a viscosity of 5 mPa s, 0.1 weight part of a 1 weight % isopropyl alcohol solution of chloroplatinic acid, and 0.01 weight part 3-phenyl-1-butyn-3-ol. This curable silicone composition was used in the evaluations. This composition gave a silicone rubber with a JIS A durometer of 8 when the composition was cured by heating for 5 minutes in a forced convection oven at 100° C.

Preparation of the Resin Sealant

The following were blended to homogeneity to give a curable epoxy resin composition: 100 weight parts epoxy resin, with epoxy equivalent weight of 165, whose main component was a bisphenol F-type epoxy resin, 120 weight parts tetraalkyltetrahydrophthalic anhydride curing agent with molecular weight of 234, and 1 weight part 1-isobutyl-2-methylimidazole cure accelerator. This resin sealant was used in the evaluation.

Adherence by the Cured Resin Sealant to the Cured Silicone

The curable silicone composition described above was coated on an aluminum plate and cured by heating for 5 minutes in a forced convection oven at 100° C. The surface of the resulting cured silicone was then treated with the primer by spraying followed by drying for 3 minutes in the forced convention oven at 100° C. The resin sealant described above was coated on the resulting cured product and was itself cured by heating for 4 hours in the forced convection oven at 120° C. The adherence of the cured resin sealant to the cured silicone was inspected and scored on the following scale.

+: strong adherence

Δ: partial de-bonding

×: complete de-bonding

Electronic Component Reliability (Semiconductor Device)

The semiconductor device shown in FIG. 1 was fabricated as follows. A semiconductor element 3 bearing an aluminum interconnect pattern on its surface was mounted on an alumina ceramic circuit substrate 1 using an adhesive 2. The bonding pads 4 on the upper edges of this semiconductor element 3 were then electrically connected to the circuit substrate 1 using gold bonding wires 6. The curable silicone composition prepared above was applied from a dispenser onto the surface of the semiconductor element 3 and the cured silicone product 7 was then produced by heating for five minutes in a forced convection oven at 100° C. The surface of the cured product 7 was thereafter treated with the primer by spraying and then drying by heating for 3 minutes in a forced convection oven at 100° C. The above-specified resin sealant was then applied from a dispenser onto the cured product 7. Due to the fluidity of this resin sealant, a rubber frame 10 (height=1 mm) had already been installed around the periphery of the semiconductor element 3. Application of the resin sealant was followed by heating for four hours in a forced convection oven at 120° C. to fabricate a semiconductor device in which cured resin sealant 9 was formed on cured silicone 7. Twenty semiconductor devices were fabricated using this procedure.

These semiconductor devices were subjected to thermal cycle testing (100 cycles, 1 cycle=30 minutes at −30° C. and 30 minutes at +100° C.). The operating defect percentage was determined on the semiconductor devices after thermal cycle testing.

Electrical Component Reliability (Capacitor)

The capacitor shown in FIG. 2 was fabricated as follows. Al-vapor-deposited (metallized) polyester film 11 was rolled up, electrodes 12 were provided by coating both ends with flame-coated metal, and outer leads 13 were electrically connected to the electrodes 12. This assembly was dipped in the curable silicone composition specified above and then heated for five minutes in a forced convection oven at 100° C. to give the cured silicone 14. The surface of this cured product 14 was treated with primer by spraying and then drying for three minutes in a forced convection oven at 100° C. The cured product 14 was then dipped in the resin sealant specified above followed by heating in a forced convection oven at 120° C. for four hours to give a capacitor with cured resin sealant 16 formed on cured silicone 14. Twenty capacitors were fabricated using this procedure.

These capacitors were subjected to moisture resistance testing consisting of standing for 1,000 hours in a 40° C./95% RH ambient. The operating defect percentage was determined on the capacitors after moisture resistance testing.

Reference Example 1

116 g 1,3,5,7-tetramethyl-1,3,5,7-tetravinylcyclotetrasiloxane, 100 g 3-glycidoxypropyltrimethoxysilane, and 0.05 g potassium hydroxide were introduced into a four-neck flask equipped with a stirrer, thermometer, and reflux condenser. An equilibration polymerization was then run over 3 hours while heating and stirring at 120° C. The reaction was then stopped with dimethyldichlorosilane. The low boilers were eliminated from the reaction mixture by vacuum distillation at 100° C./667 Pa to yield a liquid with a viscosity of 20 mPa s. Fourier transform nuclear magnetic resonance analysis of this liquid confirmed it to be organopolysiloxane with the following average unit formula.

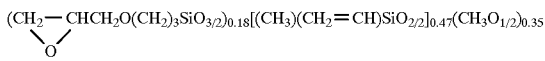

Example 1

A primer was prepared by diluting 5 weight parts of the organopolysiloxane synthesized in Reference Example 1 in 95 weight parts trimethylsiloxy-endblocked dimethylpolysiloxane with a viscosity of 0.6 mPa s. This primer was used for evaluation of the adherence by the cured resin sealant to the cured silicone and evaluation of the electrical component reliability (semiconductor device, capacitor). The results from the evaluations are reported in Table 1.

Example 2

A primer was prepared by diluting 2.5 weight parts silanol-endblocked dimethylpolysiloxane (viscosity=25 mPa s) and 2.5 weight parts 3-glycidoxypropyltrimethoxysilane in 95 weight parts trimethylsiloxy-endblocked dimethylpolysiloxane with a viscosity of 0.6 mPa s. This primer was used for evaluation of the adherence by the cured resin sealant to the cured silicone and evaluation of the electrical component reliability (semiconductor device, capacitor). The results from the evaluations are reported in Table 1.

Comparative Example 1

The adherence by the cured resin sealant to the cured silicone and the electrical component reliability (semiconductor device, capacitor) was evaluated as in Example 1, but in this case omitting the primer treatment that was carried out in Example 1. the results from the evaluations are reported in Table 1.

Comparative Example 2

A dilution was prepared of 5 weight parts 3-glycidoxypropyltrimethoxysilane in 95 weight parts trimethylsiloxy-endblocked dimethylpolysiloxane with a viscosity of 0.6 mPa s. This dilution was submitted to evaluation of the adherence by the cured resin sealant to the cured silicone and evaluation of the electrical component reliability (semiconductor device, capacitor). The results from the evaluations are reported in Table 1.

Comparative Example 3

A dilution was prepared of 5 weight parts silanol-endblocked dimethylpolysiloxane (viscosity=25 mPa s) in 95 weight parts trimethylsiloxy-endblocked dimethylpolysiloxane with a viscosity of 0.6 mPa s. This dilution was submitted to evaluation of the adherence by the cured resin sealant to the cured silicone and evaluation of the electrical component reliability (semiconductor device, capacitor). The results from the evaluations are reported in Table 1.

Comparative Example 4

The following were mixed to homogeneity to prepare an addition reaction-curing silicone composition to replace the curable silicone composition used in the evaluations: 97.9 weight parts dimethylvinylsiloxy-endblocked dimethylpolysiloxane with a viscosity of 400 mPa s, 3.3 weight parts trimethylsiloxy-endblocked dimethylsiloxane-methylhydrogensiloxane copolymer with a viscosity of 5 mPa s, 0.1 weight part of a 1 weight % solution of chloroplatinic acid in isopropyl alcohol, 2 weight parts of the organopolysiloxane prepared in Reference Example 1, and 0.01 weight part 3-phenyl-1-butyn-3-ol. This replacement composition afforded silicone rubber with a JIS A durometer of 10 when cured for 5 minutes in a forced convection oven at 100° C. The adherence by the cured resin sealant to the cured silicone and the electrical component reliability (semiconductor device, capacitor) were then evaluated as in Example 1, but in this case using the replacement composition and omitting the primer treatment that was carried out in Example 1. The results from the evaluations are reported in Table 1.

TABLE 1

|  | present invention | | comparative examples | | | |
|---|---|---|---|---|---|---|
|  | | | Comp. | Comp. | Comp. | Comp. |
|  | Example 1 | Example 2 | Example 1 | Example 2 | Example 3 | Example 4 |
| adherence by the cured resin sealant to the cured silicone | + | + | × | × | Δ | Δ |
| semiconductor device reliability operating defect % after thermal cycle testing | 0 | 0 | 15 | 15 | 5 | 10 |
| capacitor reliability operating defect % after moisture resistance testing | 0 | 0 | 10 | 5 | 5 | 5 |

We claim:

1. A method for fabricating electrical components having a surface of cured silicone thereon, comprising:
   (a) treating the surface of the cured silicone with a primer selected from the group consisting of:
      (i) a mixture of components (a) and (b),
      (ii) a reaction mixture of components (a) and (b),
      (iii) component (c),
      (iv) component (c) and a mixture of components (a) and (b), and
      (v) component (c) and a reaction mixture of components (a) and (b),
   where component (a) is silanol-functional organopolysiloxane; component (b) is epoxy-functional organoalkoxysilane; and component (c) is organopolysiloxane with the average unit formula:

$(R^1SiO_{3/2})_a(R^2{}_2SiO_{2/2})_b(R^2{}_3SiO_{1/2})_c(R^3O_{1/2})_d$ where $R^1$ is an epoxy-functional monovalent organic group; each $R^2$ is independently a monovalent hydrocarbon group, $R^3$ is selected from the group consisting of hydrogen and alkyl groups of 1 to 4 carbon atoms; a, b, and d are each a positive number; and c is 0 or a positive number;
   (B) sealing the treated cured silicone with a resin sealant; and thereafter
   (C) curing the resin sealant.

2. An electrical component fabricated by the method of claim 1, wherein said electrical component is selected from the group consisting of transistors, diodes, capacitors, resistors, and semiconductor devices that contain an electrical element.

3. The method of claim 1 wherein the cured silicone is the cured product of an addition reaction-cured silicone composition.

4. The method of claim 1 wherein the cured resin sealant is the cured product of a curable epoxy resin composition.

5. The method of claim 1 further comprising diluting the primer of step (A) with an organic solvent before treating the cured silicone coating.

6. The method of claim 1 further comprising diluting the primer of step (A) with a diluent selected from the group consisting of organopolysiloxanes and alkoxysilanes with viscosity no greater than 50 mPa s at 25° C.

7. The method of claim 6 wherein the diluent is an alkoxysilane selected from the group consisting of methyltrimethoxysilane and vinyltrimethoxysilane.

8. The method of claim 6 wherein the diluent is trimethylsiloxy-endblocked polydimethylsiloxane.

9. The method of claim 8, wherein the primer comprises (i) a mixture of components (a) and (b), wherein component (a) is silanol-endblocked dimethylpolysiloxane and component (b) is 3-glycidoxypropyltrimethoxysilane.

\* \* \* \* \*